US011557109B2

(12) United States Patent
Goto et al.

(10) Patent No.: US 11,557,109 B2
(45) Date of Patent: Jan. 17, 2023

(54) IMAGE-CAPTURING UNIT AND COMPONENT-MOUNTING DEVICE

(71) Applicant: FUJI CORPORATION, Chiryu (JP)

(72) Inventors: Hidenori Goto, Anjo (JP); Kazuya Kotani, Toyota (JP)

(73) Assignee: FUJI CORPORATION, Chiryu (JP)

( * ) Notice: Subject to any disclaimer, the term of this patent is extended or adjusted under 35 U.S.C. 154(b) by 330 days.

(21) Appl. No.: 16/980,304

(22) PCT Filed: Mar. 14, 2018

(86) PCT No.: PCT/JP2018/010026
§ 371 (c)(1),
(2) Date: Sep. 11, 2020

(87) PCT Pub. No.: WO2019/176024
PCT Pub. Date: Sep. 19, 2019

(65) Prior Publication Data
US 2021/0042562 A1 Feb. 11, 2021

(51) Int. Cl.
*G06V 10/56* (2022.01)
*H05K 13/08* (2006.01)
(Continued)

(52) U.S. Cl.
CPC ............ *G06V 10/56* (2022.01); *G06T 1/0014* (2013.01); *G06T 7/0004* (2013.01);
(Continued)

(58) Field of Classification Search
CPC .. G06V 10/56; G06V 30/2504; G06V 10/143; G06V 10/60; H05K 13/0812;
(Continued)

(56) References Cited

U.S. PATENT DOCUMENTS

2015/0215510 A1\* 7/2015 Onishi ................ H04N 5/2258
348/86

FOREIGN PATENT DOCUMENTS

JP 2000/277999 A1 \* 11/2007 ......... H05K 13/0812
JP 2010-232548 A 10/2010
JP 5798047 B2 \* 10/2015 ............ H05K 13/08

OTHER PUBLICATIONS

International Search Report dated May 15, 2018 in PCT/JP2018/010026 filed on Mar. 14, 2018, 1 page.

\* cited by examiner

*Primary Examiner* — Gandhi Thirugnanam
*Assistant Examiner* — Mychal J Gibbens
(74) *Attorney, Agent, or Firm* — Oblon, McClelland, Maier & Neustadt, L.L.P.

(57) ABSTRACT

The image-capturing unit includes an imaging section; a holding section configured to hold a subject to be imaged by the imaging section; a light irradiation section configured to select light of one or more light sources out of multiple light sources having different wavelengths, and to irradiate the subject held in the holding section with the light; a storage section configured to store a correspondence among a color of the light emitted for irradiating the subject by the light irradiation section, a material of an irradiation surface irradiated with the light, and a resolution representing the number of pixels per unit length; and an image processing section configured to obtain the resolution from the correspondence, based on the color of the light emitted for irradiating the subject and the material of the irradiation surface of the subject, and to process a subject image by using the resolution.

5 Claims, 6 Drawing Sheets

(51) Int. Cl.
    *G06T 1/00*       (2006.01)
    *G06T 7/00*       (2017.01)
    *G06V 10/143*     (2022.01)
    *G06V 30/24*      (2022.01)

(52) U.S. Cl.
    CPC ........ *G06V 10/143* (2022.01); *G06V 30/2504* (2022.01); *H05K 13/0812* (2018.08); *G06T 2207/30164* (2013.01)

(58) Field of Classification Search
    CPC .. H05K 13/08; H05K 13/081; H05K 13/0813; H05K 3/34; H05K 13/0817; H05K 13/0815; H05K 13/0419; H05K 13/0417; H05K 13/0409; H05K 13/085; H05K 13/04; G06T 1/0014; G06T 7/0004; G06T 2207/30164; G06T 5/002; G06T 7/74; G06T 2207/10016; G06T 2207/30152; G06T 2207/30141; G06T 7/001; G06T 11/00; G06T 19/00; G06T 7/00; H04N 5/222; H04N 5/225; H04N 5/2256; H04N 5/235; H04N 5/2354; H04N 5/232; H04N 5/2352; H04N 5/37206; G01B 11/00; G01B 11/24; G01B 11/25; G01B 11/0608; G01B 11/16; G01B 2210/56; G01B 11/002; H01L 24/75; H01L 2924/12043; H01L 2224/75753; H01L 2224/75745; H01L 2924/12042; H01L 2224/75901; H01L 2924/00; G06K 9/62; G06K 9/64; G01N 2021/95638
    See application file for complete search history.

IMAGE-CAPTURING UNIT AND COMPONENT-MOUNTING DEVICE

TECHNICAL FIELD

The present specification discloses an image-capturing unit and a component-mounting device.

BACKGROUND ART

Conventionally, as a component-mounting device, a component-mounting device is known in which two types of lighting devices having mutually different wavelengths and a camera for imaging a subject illuminated by the lighting devices are disposed on a base, a contrast value is calculated using each of the wavelengths, and a focusing position in a visible light wavelength, corresponding to the calculated contrast value, is obtained using a contrast curve characteristic in each wavelength obtained in advance.

PATENT LITERATURE

Patent Literature 1: JP-A-2010-232548

BRIEF SUMMARY

Technical Problem

Incidentally, in the component-mounting device, when the subject illuminated by two types of the lighting devices having mutually different wavelengths is imaged, a distance from an optical axis may vary due to influence of magnification chromatic aberration, even though the focal distances are the same. Such an influence of the magnification chromatic aberration is not conceivable in Patent Literature 1. Further, an image captured by imaging the subject may have a different resolution, depending on a material of an irradiation surface irradiated with light.

The present disclosure is made in view of the above-described problems, and a main object thereof is to suppress the influence of the magnification chromatic aberration or the material of the irradiation surface of the subject when the image captured by imaging the subject is processed.

Solution to Problem

An image-capturing unit of the present disclosure includes an imaging section; a holding section configured to hold a subject to be imaged by the imaging section; a light irradiation section configured to select light of one or more light sources out of multiple light sources having different wavelengths, and to irradiate the subject held in the holding section with the light; a storage section configured to store a correspondence among a color of the light emitted for irradiating the subject by the light irradiation section, a material of an irradiation surface irradiated with the light, and a resolution representing the number of pixels per unit length; and an image processing section configured to obtain the resolution from the correspondence, based on the color of the light emitted for irradiating the subject and the material of the irradiation surface of the subject, and to process a subject image by using the resolution, when the image processing section processes the subject image obtained by causing the imaging section to image the subject while irradiating the subject with the light of the light source selected from among the multiple light sources.

In the image-capturing unit, the storage section stores the correspondence among the color of the light emitted for irradiating the subject by the light irradiation section, the material of the irradiation surface irradiated with the light, and the resolution representing the number of pixels per unit length. The image processing section processes the subject image obtained by causing the imaging section to image the subject while irradiating the subject with the light of the light source selected from the multiple light sources. The resolution of the subject image may vary depending on the color of the light emitted for irradiating the subject and the material of the irradiation surface of the subject. Therefore, the image processing section obtains the resolution from the correspondence, based on the color of the light emitted for irradiating the subject and the material of the irradiation surface of the subject, and processes the subject image by using the resolution. Therefore, it is possible to suppress influence of magnification chromatic aberration and the material of the irradiation surface of the subject when the image captured by imaging the subject is processed.

While a component-mounting device of the present disclosure includes any one of the image-capturing units described above, the holding section holds a component serving as the subject supplied from a component supply section, moves onto a board, and releases holding of the component at a predetermined position of the board; the imaging section is disposed on a movement path in which the holding section moves to the board while holding the component; and the image processing section recognizes a position of the component with respect to the holding section by processing a captured image of the component serving as the subject image by using the resolution.

According to the component-mounting device of the present disclosure, since the component-mounting device includes any one of the image-capturing units described above, the same advantageous effect as that of any one of the image-capturing units described above can be achieved.

DESCRIPTION OF EMBODIMENTS

Figure 1:
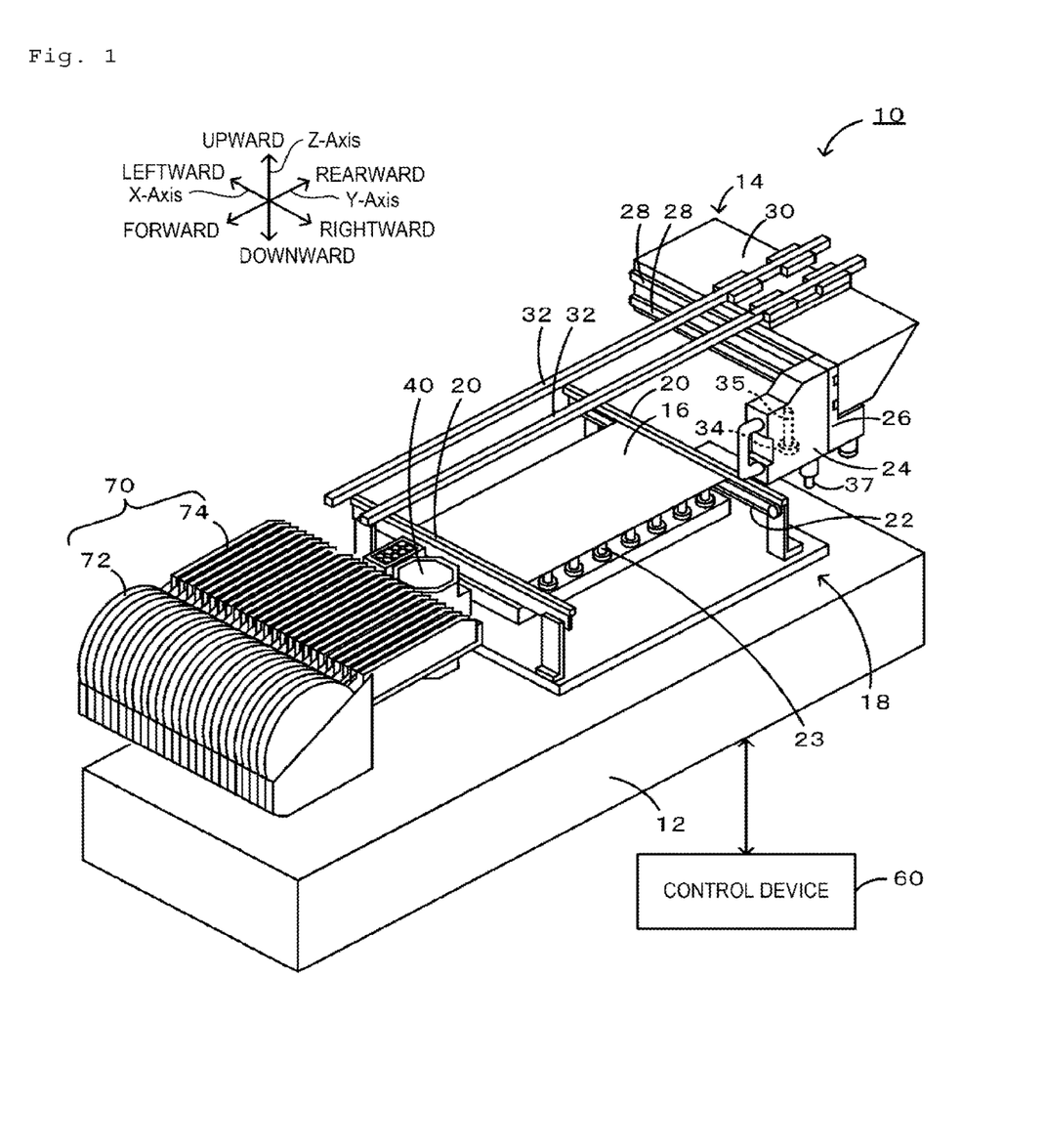
FIG. 1 is a perspective view of component-mounting device 10.
Figure 2:
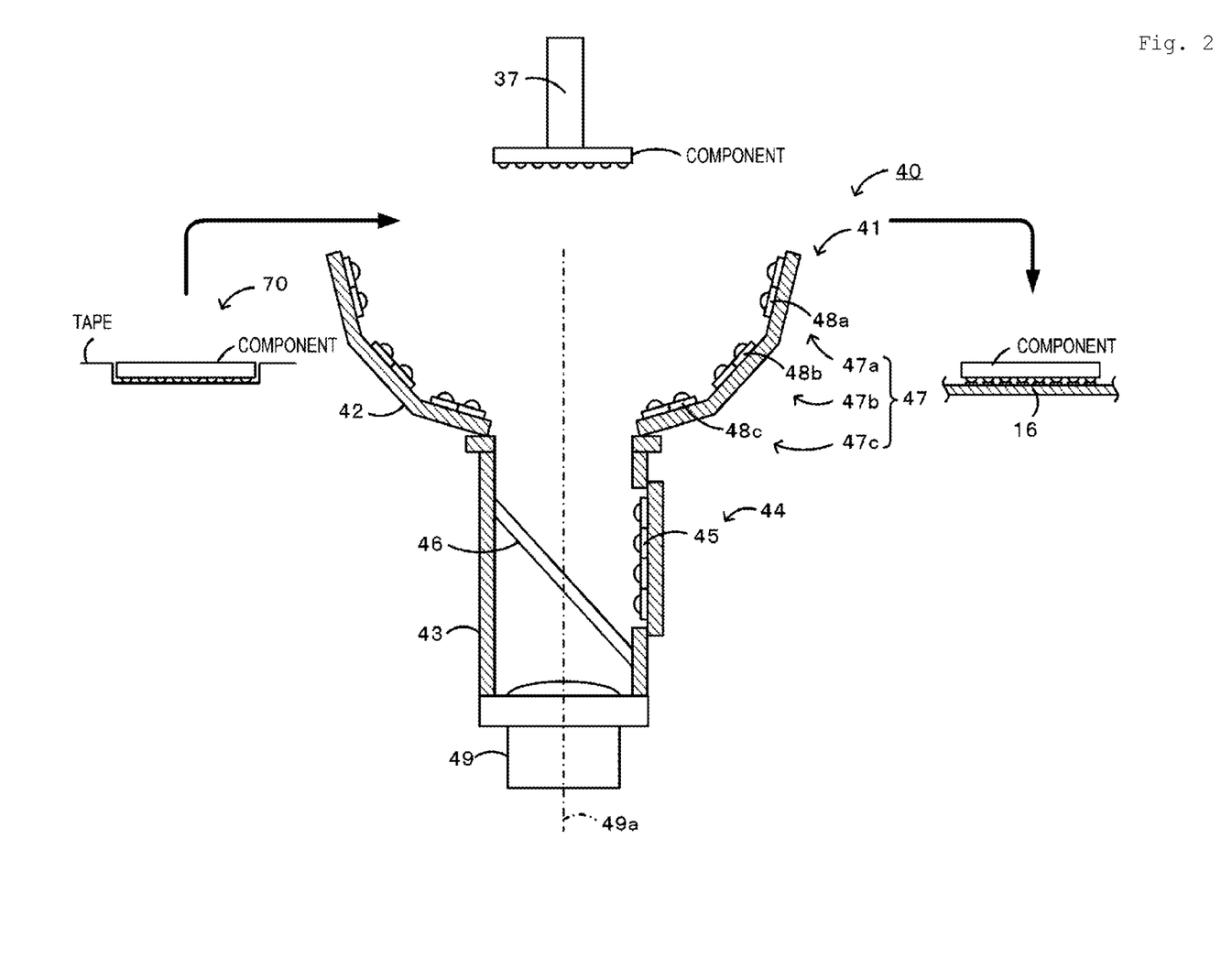
FIG. 2 is a view for schematically describing a configuration of component camera 40.
Figure 3:
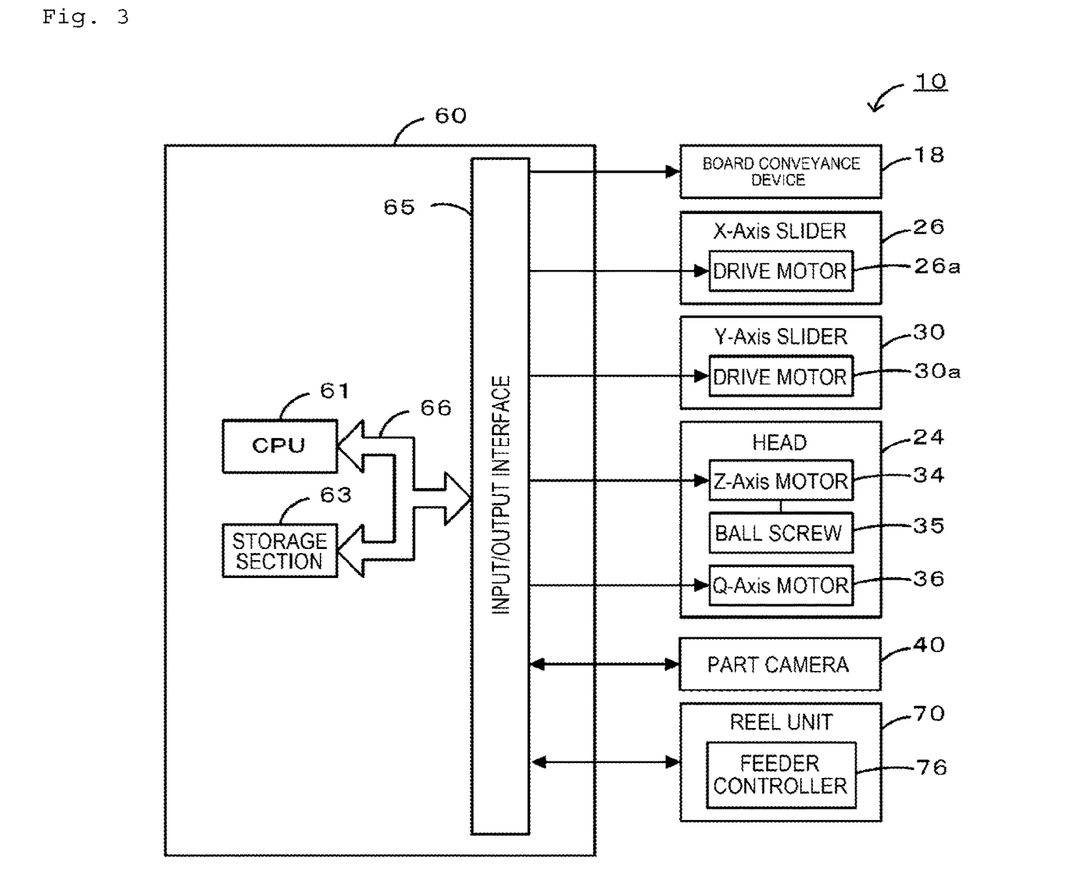
FIG. 3 is a block diagram illustrating a configuration relating to control of component-mounting device 10.

Hereinafter, preferred embodiments of an image-capturing unit and a component-mounting device of the present disclosure will be described with reference to the drawings. FIG. 1 is a perspective view of component-mounting device 10, FIG. 2 is a view for schematically describing a configuration of component camera 40, and FIG. 3 is a block diagram illustrating a configuration relating to control of component-mounting device 10. In the present embodiment, a rightward-leftward direction (X-axis), a forward-rearward direction (Y-axis), and an upward-downward direction (Z-axis) are set as illustrated in FIG. 1.

Component-mounting device 10 includes base 12, mounter body 14 installed on base 12, and reel unit 70 serving as a component supply device mounted on mounter body 14.

Mounter body 14 is installed to be exchangeable with respect to base 12. Mounter body 14 includes board conveyance device 18, head 24, nozzle 37, component camera 40, and control device 60.

Board conveyance device 18 is a device that conveys or holds board 16. Board conveyance device 18 includes support plates 20 and 20, and conveyor belts 22 and 22 (only one side is illustrated in FIG. 1). Support plates 20 and 20 are members extending in the rightward-leftward direction, and are disposed at an interval in the forward-rearward direction in FIG. 1. Conveyor belts 22 and 22 are laid to be in an endless state across driving wheels and driven wheels which are disposed in the rightward-leftward direction of support plates 20 and 20. Board 16 is conveyed from a left side to a right side by being placed on an upper surface of a pair of conveyor belts 22 and 22. Board 16 can be supported from a bottom surface side by support pins 23 erected at multiple locations. Therefore, board conveyance device 18 also serves as a board support device.

Head 24 is attached to a front surface of X-axis slider 26. X-axis slider 26 is attached to a front surface of Y-axis slider 30. Y-axis slider 30 is slidably attached to a pair of right and left guide rails 32 and 32 extending in the forward-rearward direction. A pair of upper and lower guide rails 28 and 28 extending in the rightward-leftward direction is disposed on the front surface of Y-axis slider 30. X-axis slider 26 is slidably attached to guide rails 28 and 28. Head 24 moves in the rightward-leftward direction as X-axis slider 26 moves in the rightward-leftward direction, and moves in the forward-rearward direction as Y-axis slider 30 moves in the forward-rearward direction. Each of sliders 26 and 30 is driven by each of drive motors 26a and 30a (refer to FIG. 3). In addition, head 24 is internally equipped with Z-axis motor 34, and causes Z-axis motor 34 to adjust a height of nozzle 37 attached to ball screw 35 extending along a Z-axis. Furthermore, head 24 is internally equipped with Q-axis motor 36 (refer to FIG. 3) that axially rotates nozzle 37.

Nozzle 37 is a member that picks up and holds a component in a nozzle tip, and that releases the component picked up by the nozzle tip. Nozzle 37 can supply a pressure from a pressure supply source (not illustrated), and can pick up the component, for example when a negative pressure is supplied. Nozzle 37 releases the picked-up component, when supplying the negative pressure is stopped or when a positive pressure is supplied. Nozzle 37 protrudes downward from a main body bottom surface of head 24. In addition, since nozzle 37 is raised and lowered along a Z-axis direction by Z-axis motor 34, a height of the component picked up by nozzle 37 is adjusted. Since nozzle 37 is rotated by Q-axis motor 36, an orientation of the component picked up by nozzle 37 is adjusted.

Component camera 40 is disposed in front of support plate 20 on a front side of board conveyance device 18. Component camera 40 has an imaging range above component camera 40, and generates a captured image by imaging the component held by nozzle 37 from below. As illustrated in FIG. 2, component camera 40 includes lighting section 41 and imaging section 49.

Lighting section 41 irradiates an imaging target component with light. Lighting section 41 includes housing 42, connection section 43, incident light source 44, half mirror 46, and multi-stage light source 47. Housing 42 is a bowl-shaped member whose upper surface and lower surface (bottom surface) are open in an octagonal shape. Housing 42 has a shape in which an opening of an upper surface is larger than an opening of a lower surface, and an internal space tends to increase from the lower surface toward the upper surface. Connection section 43 is a cylindrical member that connects housing 42 and imaging section 49 to each other. Incident light source 44 includes multiple LEDS 45.

The light emitted from LED 45 of incident light source 44 in a horizontal direction is reflected upward on half mirror 46. In addition, half mirror 46 transmits the light from above toward imaging section 49. Multi-stage light source 47 includes upper-stage light source 47a, middle-stage light source 47b, and lower-stage light source 47c. Upper-stage light source 47a has multiple LEDS 48a, middle-stage light source 47b has multiple LEDS 48b, and lower-stage light source 47c has multiple LEDS 48c. All of LEDS 48a to 48c irradiate the component with the light in a direction inclined from optical axis 49a. LED 48a has the largest inclination angle from optical axis 49a in an irradiation direction of LEDS 48a to 48c, and LED 48a irradiates the component with the light in a substantially horizontal direction. In addition, LED 48c has the smallest inclination angle. Since upper-stage light source 47a irradiates the component with the light in the substantially horizontal direction, upper-stage light source 47a is referred to as a sideway irradiation light source, and since middle-stage light source 47b irradiates the component with the light in an obliquely upward direction, middle-stage light source 47b is referred to as an inclined light source. In the present embodiment, LED 48a of upper-stage light source 47a is a blue LED, and LED 48b of middle-stage light source 47b, LED 48c of lower-stage light source 47c, and LED 45 of incident light source 44 are red LEDS.

Imaging section 49 generates a captured image, based on the received light. Imaging section 49 includes an optical system such as a lens (not illustrated) and an imaging element (for example, CCD). When the light after being emitted from incident light source 44 and multi-stage light source 47 and reflected on the imaging target component reaches imaging section 49 through half mirror 46, imaging section 49 receives the light, and generates the captured image.

Reel unit 70 includes multiple reels 72, and is detachably attached to a front side of mounter body 14. A tape is wound around each reel 72. A top surface of the tape has multiple accommodation recesses along a longitudinal direction of the tape. Each of the accommodation recesses accommodates the component.

The components are protected by a film that covers the top surface of the tape. The tape is unwound rearward from the reel, and the film is detached in feeder section 74, thereby bringing the component into an exposed state. The component in the exposed state is picked up by nozzle 37. An operation of reel unit 70 is controlled by feeder controller 76 (refer to FIG. 3) included in each feeder section 74.

As illustrated in FIG. 3, control device 60 includes CPU 61, storage section 63 (ROM, RAM, and HDD), and input/output interface 65, and these are connected to each other via bus 66. Control device 60 outputs a drive signal to a pressure supply source (not illustrated) for board conveyance device 18, drive motor 26a of X-axis slider 26, drive motor 30a of Y-axis slider 30, Z-axis motor 34, Q-axis motor 36, component camera 40, and nozzle 37. In addition, control device 60 inputs the captured image obtained from component camera 40. Control device 60 is connected to feeder controller 76 of reel unit 70 to be capable of communicating with feeder controller 76. Although not illustrated, each of sliders 26 and 30 is equipped with position sensors (not illustrated), and while inputting position information obtained from the position sensors, control device 60 controls drive motor 26a and 30a of each of sliders 26 and 30.

Next, an operation of component-mounting device 10 will be described. CPU 61 of control device 60 receives a production job from a management computer (not illustrated). The production job is information for determining whether component-mounting device 10 mounts any type of component on board 16 in any order, or how many boards 16 are used for mounting the components.

Figure 4:
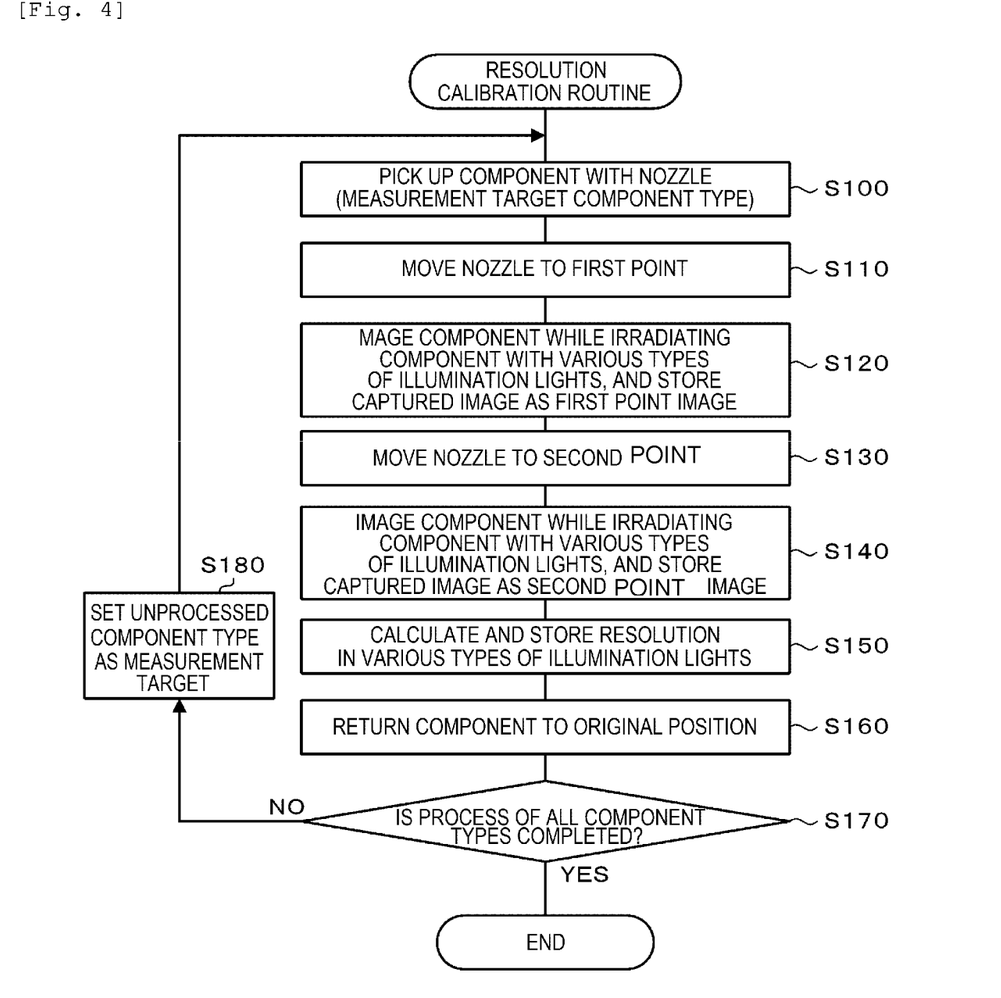
FIG. 4 is a flowchart of a resolution calibration routine.

When CPU 61 receives the production job, CPU 61 first reads all of the component types mounted on board 16 in the production job, and calibrates a resolution (calibration). FIG. 4 is a flowchart of a resolution calibration routine.

Figure 5:
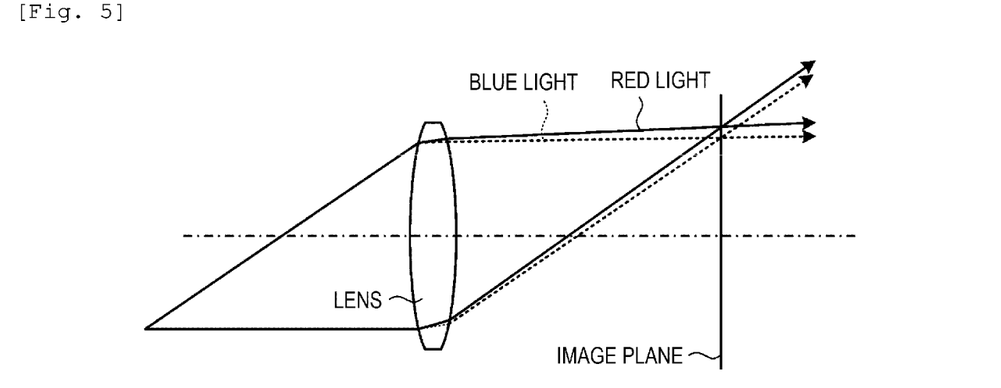
FIG. 5 is a view for describing magnification chromatic aberration.

Prior to the description of the resolution calibration routine, magnification chromatic aberration will be described. The magnification chromatic aberration means a phenomenon in which a color shift occurs particularly in an image periphery since the image is formed at a different position on an image plane by the light incident obliquely with respect to the optical axis. Specifically, as illustrated in FIG. 5, even if focal distances are the same as each other, distances from a center line of the lens are different from each other between blue light and red light. In addition, the distances are different from each other depending on a material of an irradiation surface irradiated with the light. In the present embodiment, influence of the magnification chromatic aberration or the material of the irradiation surface is eliminated by calibrating the resolution when image processing is performed.

When CPU 61 starts the resolution calibration routine in FIG. 4, one component type to be used in the current production job is first set as the measurement target component type, and the component of the component type is picked up by nozzle 37 (S100). Specifically, CPU 61 controls each section so that nozzle 37 faces the component fed to a predetermined component supply position by feeder section 74 for supplying the component of the component type, and supplies the negative pressure to nozzle 37 so that the component is picked up by nozzle 37.

Subsequently, CPU 61 moves nozzle 37 so that a center of nozzle 37 coincides with first point P1 (S110). First point P1 is one point on coordinates of component-mounting device 10, and is set inside an imaging range above component camera 40 (refer to FIG. 6).

Subsequently, CPU 61 images the component picked up by nozzle 37 while irradiating the component with various types of illumination light, and causes storage section 63 to store the image captured by imaging the component, as a first point image (S120). Here, various types of illumination light are three types of illumination light such as the red light, the blue light, and the red light+the blue light. CPU 61 first images the component while a red LED (LED 48b of middle-stage light source 47b, LED 48c of lower-stage light source 47c, and LED 45 of the incident light source) irradiates the component, subsequently, images the component while a blue LED (LED 48a of upper-stage light source 47a) irradiates the component, and subsequently, images the component while the red LED and the blue LED irradiate the component. CPU 61 causes storage section 63 to store the current component type and the first point image captured using various types of illumination light in association with each other.

Subsequently, CPU 61 moves nozzle 37 so that the center of nozzle 37 coincides with second point P2 (S130). Second point P2 is one point on the coordinates of component-mounting device 10, and is set inside the imaging range above component camera 40 (refer to FIG. 6). Second point P2 is set at a position separated from first point P1 by a predetermined length Lx [μm] in a leftward direction along the X-axis.

Subsequently, CPU 61 images the component while irradiating the component picked up by nozzle 37 with various types of illumination light, and causes storage section 63 to store the image captured by imaging the component, as a second point image (S140). CPU 61 first images the component while the red LED irradiates the component, subsequently images the component while the blue LED irradiates the component, and thereafter, images the component while the red LED and the blue LED irradiate the component. CPU 61 causes storage section 63 to store the current component type and the second point image captured using various types of illumination light in association with each other.

Figure 6:
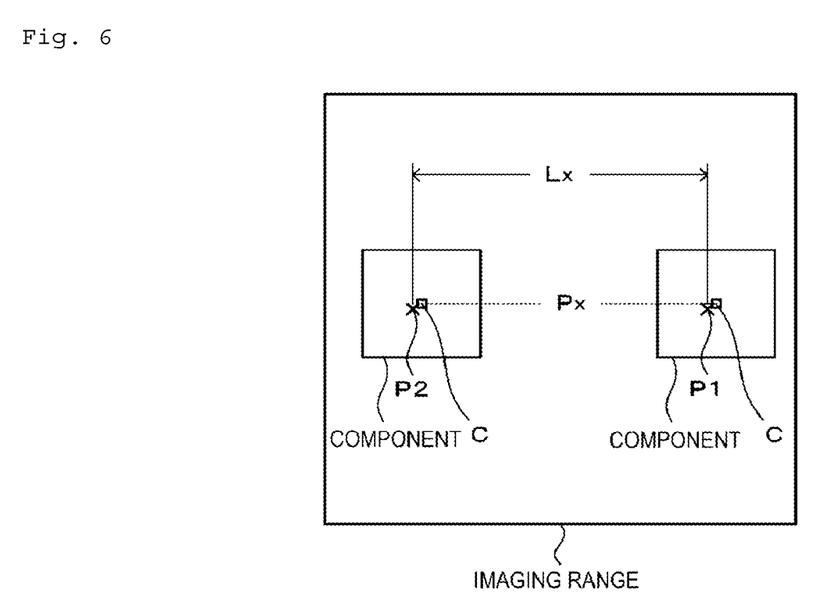
FIG. 6 is a view for describing a parameter used in calculating a resolution.

Next, CPU 61 calculates the resolution of various types of illumination light for the current component type, and causes storage section 63 to store the calculated resolution (S150). FIG. 6 is a view for describing a parameter used for calculating the resolution. As illustrated in FIG. 6, CPU 61 obtains pixel number Px between pixel position C of the component center of the first point image (right side in FIG. 6) captured using the red light and pixel position C of the component center of the second point image (left side in FIG. 6) captured using the red light, and obtains resolution (=Lx/Px) [μm/pixel] of the red light for the component type. Length [μm] between component center C at first point P1 and component center C at second point P2 coincides with length Lx[μm] between first point P1 and second point P2 of the nozzle center. Similarly, CPU 61 obtains the resolution of the blue light or the red light+the blue light. Then, a correspondence among the current component type, the illumination light, and the resolution is added to a resolution calibration table illustrated in Table 1, and is stored in storage section 63.

TABLE 1

| Illumination Light Color | Resolution [μm/pixel] | | | |
| --- | --- | --- | --- | --- |
| | Component Type Pa | Component Type Pb | Component Type Pc | Component Type Pd |
| Red Light | 23.90 | 23.90 | 23.90 | 23.89 |
| Blue Light | 23.95 | 23.95 | 23.95 | 23.94 |
| Red Light + Blue Light | 23.90 | 23.92 | 23.90 | 23.86 |

Subsequently, CPU 61 returns the component picked up by nozzle 37 to an original position of feeder section 74 (S160), and determines whether or not all of the component types to be mounted on board 16 are processed (S170). When the determination is negative in S170, CPU 61 sets an unprocessed component type as the measurement target (S180), and performs the process in S100 and subsequent processes again. On the other hand, when the determination is affirmative in S170, CPU 61 completes this routine. In this manner, a resolution calibration table is completely prepared in Table 1 indicating the correspondence among the component type (for example, component types Pa to Pd) used in the current production job, the illumination light, and the resolution.

Figure 7:
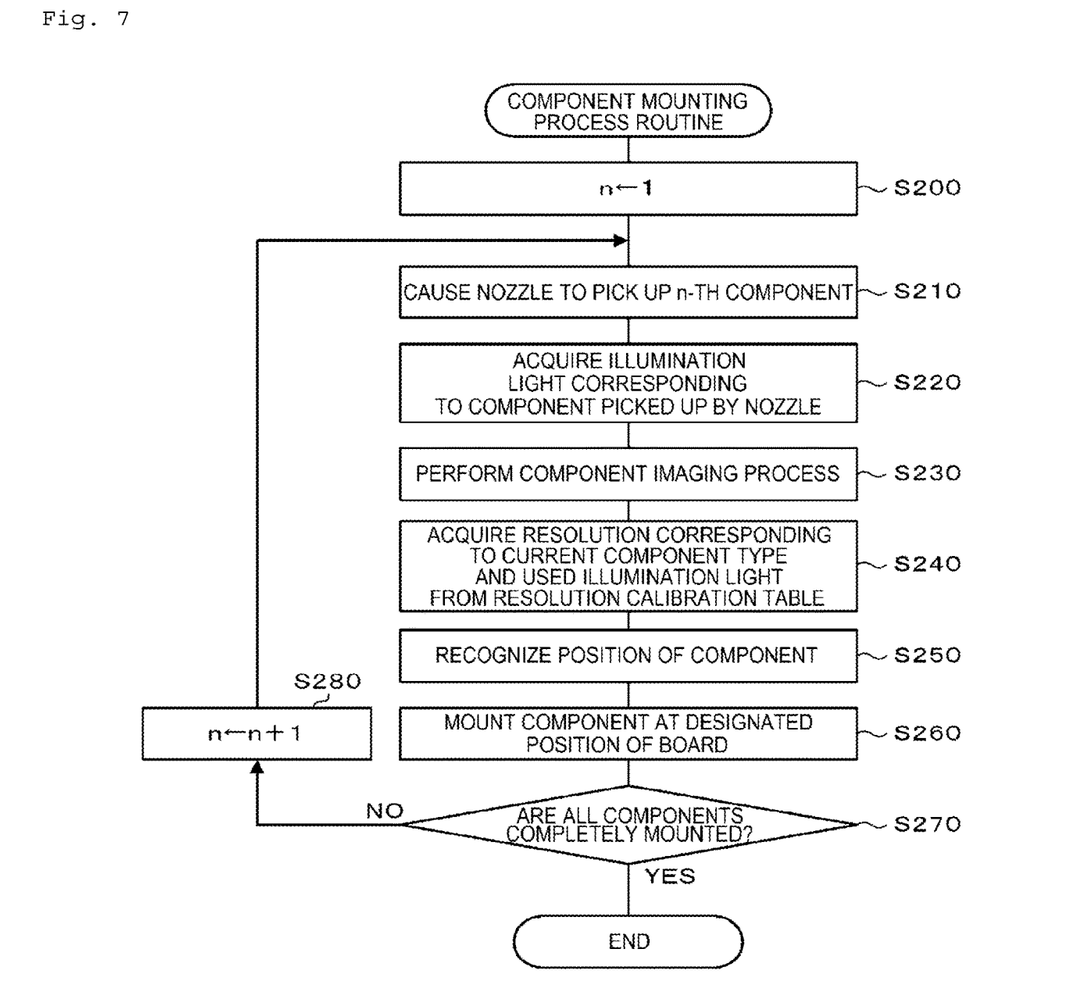
FIG. 7 is a flowchart of a component image processing routine.

Next, an operation when component-mounting device 10 performs a component mounting process will be described. CPU 61 of control device 60 controls each section of component-mounting device 10, based on the production job, and produces board 16 on which the multiple components are mounted. FIG. 7 is a flowchart of a component mounting process routine.

When CPU 61 starts the component mounting process routine, CPU 61 first sets a variable n of a counter to 1 (S200), and causes nozzle 37 to pick up a $n^{-th}$ component (S210). Next, CPU 61 acquires the illumination light corresponding to the component type of the current component from an illumination light table (refer to Table 2) stored in storage section 63 (S220). The illumination light table shows a correspondence among the component type, a material of the irradiation surface of the component of the component type, and the illumination light used when the component of the component type is imaged. The illumination light table is prepared, based on results of examining the illumination light which is most suitable for imaging each component of the component type in advance through preliminary experiments. The material of the irradiation surface of the component may be omitted from the illumination light table.

TABLE 2

| Component Type | Material | Illumination Light |
| --- | --- | --- |
| Pa | A | Blue Light |
| Pb | B | Red Light |
| Pc | A | Blue Light + Red Light |
| Pd | C | Red Light |
| . | . | . |
| . | . | . |
| . | . | . |

Next, CPU 61 performs component image processing (S230). Specifically, CPU 61 moves the component picked up by nozzle 37 to an imaging range above component camera 40, and causes component camera 40 to image the component while irradiating the component with the illumination light acquired in S220.

Subsequently, CPU 61 acquires the resolution corresponding to the current component type and the used illumination light, from the resolution calibration table in Table 1 (S240), and recognizes a position of the component with respect to the center of nozzle 37 by using the obtained component image and the acquired resolution (S250). The center position of nozzle 37 in the image captured by imaging the component is known. The center of nozzle 37 is controlled to coincide with a predetermined pickup position of the component (usually the center of the component). However, in many cases, due to a deviation of the component supply position, the component is picked up in a state where the center of nozzle 37 and the predetermined pickup position of the component are displaced from each other. Therefore, in S250, CPU 61 recognizes a deviation amount between the predetermined pickup position of the component and the center of nozzle 37. A unit of the deviation amount obtained from the image is a pixel. Therefore, the resolution is used to replace the pixel with the unit of length (μm here). As described above, the resolution depends on the component type (in other words, the material of the irradiation surface of the component type) and the illumination light. Here, a proper resolution obtained from the resolution calibration table in Table 1 is used so that the pixel is replaced with the length (μm) for the unit of the deviation amount between the center of nozzle 37 and the predetermined pickup position of the component. Therefore, the deviation amount obtained by replacing the pixel with the unit of length is highly accurate.

Subsequently, CPU 61 mounts the component picked up by nozzle 37 at a designated position on board 16 (S260). Specifically, CPU 61 controls each section so that the component is disposed directly above the designated position of board 16 in view of the deviation amount (unit of length) of the position of the component with respect to the center of nozzle 37, and supplies the positive pressure to nozzle 37 so that nozzle 37 releases the component at the position.

Subsequently, CPU 61 determines whether or not all of the components are completely mounted (S270). If the determination is negative in S270, CPU 61 increments the variable n of the counter by 1 (S280), and performs the process in S210 and subsequent processes again. On the other hand, when the determination is affirmative in S270, CPU 61 completes this routine. In this way, the components of all component types are mounted on one board 16. Thereafter, CPU 61 repeats the component mounting process routine until the number of boards 16 having the mounted components reaches a production scheduled number in the production job.

Here, a correspondence between a configuration element of the present embodiment and a configuration element of the image-capturing unit of the present disclosure will be described. Imaging section 49 of the present embodiment corresponds to the imaging section of the image-capturing unit of the present disclosure, nozzle 37 corresponds to the holding section, lighting section 41 corresponds to the light irradiation section, storage section 63 corresponds to the storage section, CPU 61 corresponds to the image processing section. In addition, the component correspond to the subject.

In the present embodiment described above, the resolution of the image captured by imaging the component may differ depending on the color of the light emitted for irradiating the component and the material of the irradiation surface of the component. Therefore, CPU 61 obtains the resolution from the resolution calibration table, based on the color of the light emitted for irradiating the component and the component type (example of the material of the irradiation surface of the component), and processes the image of the component by using the resolution. Therefore, it is possible to suppress the influence of the magnification chromatic aberration or the material of the irradiation surface when the image captured by imaging the component is processed.

In addition, lighting section 41 includes the red LED (LED 48b of middle-stage light source 47b, LED 48c of lower-stage light source 47c, and LED 45 of incident light source 44) and the blue LED (LED 48a of upper-stage light source 47a). Therefore, the component can be irradiated with any one of three patterns including the red light, the blue light, and the red light+the blue light. In particular, when the component is irradiated with the pattern of the red light+the blue light, since the resolution may vary depending on the component type, it is highly meaningful to apply the technique of the present disclosure to this case.

As a matter of course, the present disclosure is not limited to the above-described embodiments, and may be implemented in various aspects as long as the aspects belong to the technical scope of the present disclosure.

For example, in the above-described embodiment, although the table (Table 1) indicating the correspondence among the component type, the illumination light, and the resolution is used as the resolution calibration table, a table (Table 3) indicating a correspondence among the material of the irradiation surface of the component, the illumination light, and the resolution may be used. For example, the material of the irradiation surface of the component is a material itself in a case where the material is directly used as the irradiation surface. The material is not particularly limited, and for example, the material includes iron, copper, silver, gold, alumina ceramic, zirconia ceramic, an acrylic resin, and an epoxy resin. In addition to the materials, for example, in a case where the irradiation surface is colored with a colorant, the material of the irradiation surface is the colorant, and in a case where the irradiation surface is coated with a coating agent, the material of the irradiation surface is the coating agent. Since the material of the irradiation surface of the component is inevitably determined when the component type is determined, the component type can be regarded as an example of the material of the irradiation surface of the component. In a case where the materials of the irradiation surfaces of the components of two or more different component types are the same as each other, a data size is reduced by adopting the table (Table 3) indicating the correspondence among the material of the irradiation surface of the component, the illumination light, and the resolution. For example, in Table 1, the resolution is associated with each illumination light for each of four component types Pa to Pd. Here, as illustrated in Table 2, the irradiation surface of both component type Pa and component type Pc is formed of a material A. Therefore, when the table of Table 3 using the material instead of the component type is adopted, the number of data is reduced.

TABLE 3

| Illumination Light Color | Resolution [μm/pixel] | | |
|---|---|---|---|
| | Material A | Material B | Material C |
| Red Light | 23.90 | 23.90 | 23.89 |
| Blue Light | 23.95 | 23.95 | 23.94 |
| Red Light + Blue Light | 23.90 | 23.92 | 23.86 |

In the above-described embodiment, the resolution itself is used as the resolution, but a correction coefficient for a predetermined reference resolution may be used. As the predetermined reference resolution, it is possible to use a resolution obtained from an image captured when a reference material (for example, a white ceramic piece) is irradiated with the light.

In the above-described embodiment, the resolution calibration table is prepared using the resolution measured when nozzle 37 is moved in an X-direction, but may be prepared using the resolution measured when nozzle 37 is moved in a Y-direction. Alternatively, the resolution calibration table may be prepared for each of the resolution in the X-direction and the resolution in the Y-direction, the resolution in the X-direction may be used when the number of pixels in the X-direction is converted into the length, and the resolution in the Y-direction may be used when the number of pixels in the Y-direction is converted into the length.

In the above-described embodiment, although the resolution calibration table (Table 1) is prepared in which the resolutions of the three illumination light are associated with the component type, in a case where optimum illumination light for each component type is known as illustrated in the illumination light table in Table 2, the resolution calibration table may be prepared in which the resolution of the optimum illumination light is associated with the component type (for example, component type Pa is associated with only the resolution of the blue light, and component type Pb is associated with only the resolution of the red light). In this case, a time required for preparing the resolution calibration table is shortened.

In the above-described embodiment, although the resolution calibration table is prepared using component-mounting device 10, instead of component-mounting device 10, an off-line imager separate from component-mounting device 10 may be used, the lighting section the same as lighting section 41 may be attached to the off-line imager, the resolution calibration table may be prepared in the same manner as that of the above-described procedure.

In the resolution calibration routine of the above-described embodiment, although the resolution is calculated for all of the component types used in the production job, the processes in S100 to S160 may be skipped for the component types in which the resolution of each illumination light is previously stored in storage section 63.

In the above-described embodiment, although head 24 including one nozzle 37 is used, a rotary head including multiple nozzles disposed in a circumferential direction may be used.

In the above-described embodiment, although three types of the illumination lights including the blue light, the red light, and the blue light and the red light are used as an example, the present disclosure is not particularly limited thereto, and other illumination light (for example, green light, UV light, or IR light) may be used instead of or in addition to the above-described illumination light.

In the above-described embodiment, although component camera 40 is used as an example of the configuration element of the image-capturing unit of the present disclosure, the present disclosure is not particularly limited thereto, and any camera may be used as long as the camera has a multicolor lighting device having no countermeasure for chromatic aberration on the lens side.

In the above-described embodiment, although nozzle 37 is used as an example of the holding section of the image-capturing unit of the present disclosure, the present disclosure is not particularly limited thereto, and a mechanical chuck or an electromagnet may be used, for example.

In the above-described embodiment, although reel unit 70 is used as an example of the component supply section of the component-mounting device of the present disclosure, the present disclosure is not particularly limited thereto, and, a tray unit for mounting the component on a tray by supplying the component may be adopted, for example.

The image-capturing unit of the present disclosure may be configured as follows.

In the image-capturing unit of the present disclosure, the multiple light sources may include at least a blue light source and a red light source. In this case, the subject can be irradiated with any one of three patterns including the blue light, the red light, and the red light+the blue light. In particular, when the subject is irradiated with the pattern of the red light+the blue light, since the resolution may vary depending on the material of the subject, it is highly meaningful to apply the technique of the present disclosure to this case.

In the image-capturing unit of the present disclosure, the resolution itself may be used as the resolution, or the correction coefficient for the predetermined reference resolution may be used. The predetermined reference resolution is the resolution obtained from the image captured when the reference material (for example, the white ceramic piece) is irradiated with the light.

In the image-capturing unit of the present disclosure, the subject is the component to be mounted on the board, and as the material of the irradiation surface, a type of the component may be used. In this case, the correspondence among the color of the light, a type of the component, and the resolution is stored in the storage section, and the resolution can be obtained from the correspondence, based on the color of the light and the component type.

INDUSTRIAL APPLICABILITY

The present disclosure can be used for an industry involving work for imaging the component held by the holding section.

REFERENCE SIGNS LIST 10 component-mounting device, 12 base, 14 mounter body, 16 board, 18 board conveyance device, 20 support plate, 22 conveyor belt, 23 support pin, 24 head, 26 X-axis slider, 26a drive motor, 28 guide rail, 30 Y-axis slider, 30a drive motor, 32 guide rail, 34 Z-axis motor, 35 ball screw, 36 Q-axis motor, 37 nozzle, 40 component camera, 41 lighting section, 42 housing, 43 connection section, 44 incident light source, 45 LED, 46 half mirror, 47 multi-stage light source, 47a upper-stage light source, 47b middle-stage light source, 47c lower-stage light source, 48a to 48c LED, 49 imaging section, 49a optical axis, 60 control device, 61 CPU, 63 storage section, 65 input/output interface, 66 bus, 70 reel unit, 72 reel, 74 feeder section, 76 feeder controller

The invention claimed is:
1. An image-capturing unit comprising:
an imaging section;
a holding section configured to hold a subject to be imaged by the imaging section;
a light irradiation section configured to select light of one or more light sources out of multiple light sources having different wavelengths and to irradiate the subject held in the holding section with the light;
a storage section configured to store a correspondence among a color of the light emitted for irradiating the subject by the light irradiation section, a material of an irradiation surface irradiated with the light, and a resolution representing the number of pixels per unit length; and
an image processing section configured to obtain the resolution from the correspondence, based on the color of the light emitted for irradiating the subject and the material of the irradiation surface of the subject, and to process a subject image by using the resolution, when the image processing section processes the subject image obtained by causing the imaging section to image the subject while irradiating the subject with the light of the light source selected from among the multiple light sources.

2. The image-capturing unit according to claim 1, wherein the multiple light sources include at least a blue light source and a red light source.

3. The image-capturing unit according to claim 1, wherein as the resolution, a resolution itself is used, or a correction coefficient for a predetermined reference resolution is used.

4. The image-capturing unit according to claim 1, wherein the subject is a component to be mounted on a board, and a type of the component is used as the material of the irradiation surface.

5. A component-mounting device comprising:
the image-capturing unit according to claim 1,
wherein the holding section holds a component serving as the subject supplied from a component supply section, moves onto a board, and releases holding of the component at a predetermined position of the board,
wherein the imaging section is disposed on a movement path in which the holding section moves to the board while holding the component, and
wherein the image processing section recognizes a position of the component with respect to the holding section by processing a captured image of the component serving as the subject image by using the resolution.

* * * * *